United States Patent
Fu et al.

(10) Patent No.: US 8,450,767 B2
(45) Date of Patent: May 28, 2013

(54) LIGHT-EMITTING DEVICE

(75) Inventors: Huang-Chien Fu, Hsinchu (TW);
Shih-I Chen, Hsinchu (TW); Yi Ming Chen, Hsinchu (TW); Tzu Chieh Hsu, Hsinchu (TW); Jhih-Sian Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/005,075

(22) Filed: Jan. 12, 2011

(65) Prior Publication Data

US 2011/0101404 A1 May 5, 2011

Related U.S. Application Data

(63) Continuation-in-part of application No. 12/437,908, filed on May 8, 2009, now Pat. No. 7,906,795.

(51) Int. Cl.
*H01L 33/10* (2010.01)
*H01L 33/00* (2010.01)

(52) U.S. Cl.
USPC .. 257/99; 257/98; 257/E33.07; 257/E33.023; 257/E33.001

(58) Field of Classification Search
USPC .......... 257/99, 98, 102, 103, 88; 345/87, 345/92; 438/21; 349/113
See application file for complete search history.

(56) References Cited

U.S. PATENT DOCUMENTS

| 5,309,001 | A | 5/1994 | Wantanabe et al. |
| 5,744,828 | A | 4/1998 | Nozaki et al. |
| 2003/0185265 | A1* | 10/2003 | Henrichs .................... 372/96 |
| 2004/0195641 | A1* | 10/2004 | Wirth ........................ 257/433 |
| 2006/0163603 | A1* | 7/2006 | Takeuchi et al. ............. 257/103 |
| 2008/0308832 | A1* | 12/2008 | Hsieh et al. ................... 257/98 |

* cited by examiner

*Primary Examiner* — Jarrett Stark
*Assistant Examiner* — Lawrence Tynes, Jr.
(74) *Attorney, Agent, or Firm* — Muncy, Geissler, Olds & Lowe, PLLC

(57) ABSTRACT

This disclosure discloses a light-emitting device. The light-emitting device comprises: a substrate; and a first light-emitting unit comprising a plurality of light-emitting diodes electrically connected to each other on the substrate. A first light-emitting diode in the first light-emitting unit comprises a first semiconductor layer with a first conductivity-type, a second semiconductor layer with a second conductivity-type, and a light-emitting stack formed between the first and second semiconductor layers. The first light-emitting diode in the first light-emitting unit further comprises a first connecting layer on the first semiconductor layer for electrically connecting to a second light-emitting diode in the first light-emitting unit; a second connecting layer, separated from the first connecting layer, formed on the first semiconductor layer; and a third connecting layer on the second semiconductor layer for electrically connecting to a third light-emitting diode in the first light-emitting unit.

14 Claims, 7 Drawing Sheets

LIGHT-EMITTING DEVICE

This application is a continuation-in-part of U.S. patent application Ser. No. 12/437,908, entitled "Light-emitting device", filed on May 8, 2009, and the content of which is hereby incorporated by reference.

BACKGROUND

1. Technical Field

The present disclosure relates to a light-emitting device, and in particular to a light-emitting device comprising a plurality of recesses in a semiconductor window layer.

2. Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in household appliances, indicator light of instruments, and opto-electrical products, etc. However, how to improve the light-emitting efficiency of light-emitting devices is still an important issue in this art.

SUMMARY OF THE DISCLOSURE

The present disclosure provides a light-emitting device.

The light-emitting device comprises: a substrate; a transparent conductive layer disposed on the substrate; a semiconductor window layer formed on the transparent conductive layer and having a flat surface and a plurality of recesses, wherein each of the recesses has a side wall surface; and a light-emitting stack formed on the semiconductor window layer and comprising a first conductivity semiconductor layer, a second conductivity semiconductor layer, and an active layer sandwiched between the first and second conductivity layers. The side wall surface of one of the recesses is inclined with respect to the flat surface, and the contact resistance between the flat surface and the transparent conductive layer is less than that between the side wall surface in each recess and the transparent conductive layer.

In another embodiment of the present disclosure, a light light-emitting device is provided.

The light light-emitting device comprises: a substrate; a transparent conductive layer disposed on the substrate; a semiconductor window layer formed on the transparent conductive layer and having a flat surface and a plurality of recesses, wherein each of the recesses has a side wall surface; an ohmic contact layer formed between the semiconductor window layer and the transparent conductive layer; and a light-emitting stack formed on the semiconductor window layer and comprising a first conductivity semiconductor layer, a second conductivity semiconductor layer, and an active layer sandwiched between the first and second conductivity layers. The semiconductor window layer and the ohmic contact layer comprise the same material.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

For to better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
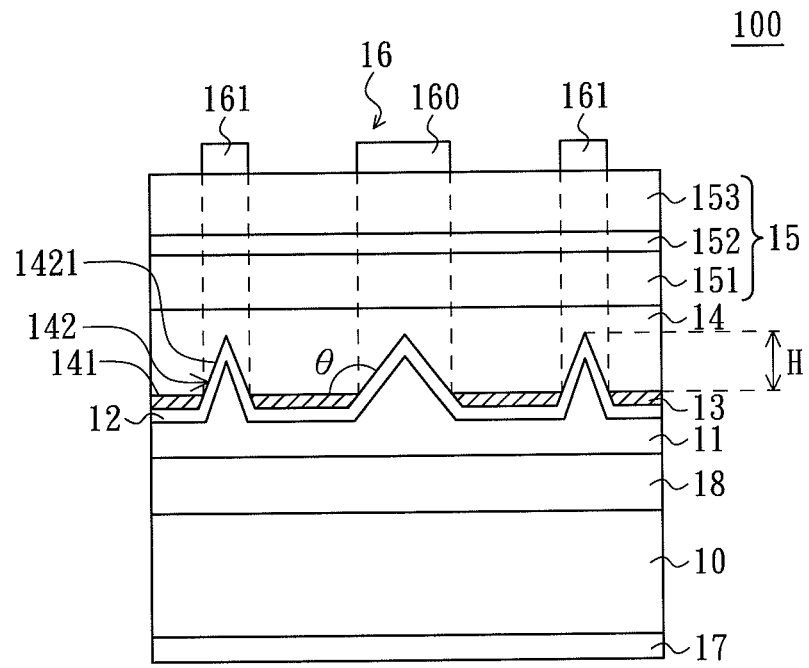
FIG. 1 shows a cross-sectional view of a light-emitting device in accordance with the first embodiment of the present disclosure.

FIG. 1 discloses a light-emitting device 100 according to the first embodiment of the present disclosure. The light-emitting device 100 comprises a permanent substrate 10, a bonding layer 18, a reflective layer 11, a transparent conductive layer 12, an ohmic contact layer 13, a semiconductor window layer 14, and a light-emitting stack 15. The light-emitting stack 15 comprises a p-type semiconductor layer 151, an n-type semiconductor layer 153, and an active layer 152 sandwiched between the p-type and n-type semiconductor layers 151, 153. The semiconductor window layer 14 has a flat surface 141 and a plurality of recesses 142. Each of the recesses has a side wall surface 1421 which is inclined with respect to the flat surface 141 at an angle ($\Theta$) greater than 90° and less than 180°. Preferably, the angle ($\Theta$) ranges from 110° to 160°. In this embodiment, the recesses 142 have triangular shaped cross-sections. The ohmic contact layer 13 is formed between the semiconductor window layer 14 and the transparent conductive layer 12 at position corresponding to the flat surface 141 of the semiconductor window layer 14. A surface area ratio of the surface area of the ohmic contact layer 13 to the surface area of the semiconductor window layer 14 ranges from 10% to 90%. The recesses have a depth (H) and the depth ratio of the depth of the recesses 142 to the thickness of the semiconductor window layer 14 ranges from 20% to 80%.

Referring to FIG. 1, the light-emitting device 100 further comprises an n-side electrode 16 formed on the light-emitting stack 15 and a p-side electrode 17 formed on the permanent substrate 10. The n-side electrode 16 comprising a bonding pad 160 and an extension 161 extending from the bonding bad 160 are formed on the light-emitting stack 15 at positions corresponding to the recesses 142. In this embodiment, the ohmic contact layer 13 is substantially made of the same material as the semiconductor window layer 14. In addition, the ohmic contact layer 13 further comprises doping impurities for ohmically contacting the transparent conductive layer 12. Therefore, the contact resistance between the flat surface 141 and the transparent conductive layer 12 is less than that between the side wall surface 1421 and the transparent conductive layer 12, which results in that, when a power source is applied on the n-side electrode 16, most current flows through the flat surface 141 of the semiconductor window layer 14, thereby obtaining a current-blocking effect between the side wall surface 1421 and the transparent conductive layer 12. Furthermore, the light emitted from the light-emitting stack 15 is reflected at the side wall surface 1421 and is directed to escape from a light-emitting surface of the light-emitting stack 15 for enhancing the light extraction efficiency. The semiconductor window layer 14 is made of a material selected from the group consisting of GaP, InGaP, GaAs, AlGaAs, and combinations thereof. The doping impurities comprise a material selected from the group consisting of Mg, Be, Zn, C, and combinations thereof.

Figure 2:
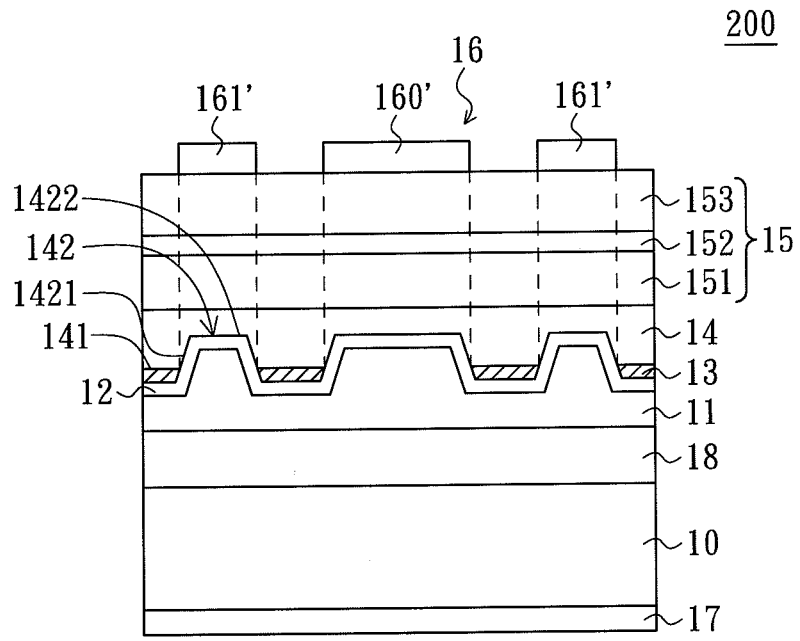
FIG. 2 shows a cress-sectional view of a light-emitting device in accordance with the second embodiment of the present disclosure.

FIG. 2 discloses a light-emitting device 200 according to the second embodiment of the present disclosure. The second embodiment of the light-emitting device 200 has the similar structure with the first embodiment of the light-emitting device 100 except that the recesses 142 have trapezoid shaped cross-sections and each of the recesses 142 further has a recessed surface 1422. The recessed surface 1422 in each recess 142 is substantially parallel to the flat surface 141. The bonding pad 160' and the extension 161' are formed at positions corresponding to the recessed surface 1422 and the side wall surface 1421. Alternatively, the n-type electrode 16 can be merely formed at position corresponding to the recessed surface 1422 (not shown). The contact resistance between the recessed surface 1422 and the transparent conductive layer 12 is substantially equal to that between the side wall surface 1421 and the transparent conductive layer 12. It is noted that the cross-section of the recesses 142 comprises at least one pattern selected from the group consisting of triangular shape, trapezoid shape, and combinations thereof.

Figure 3:
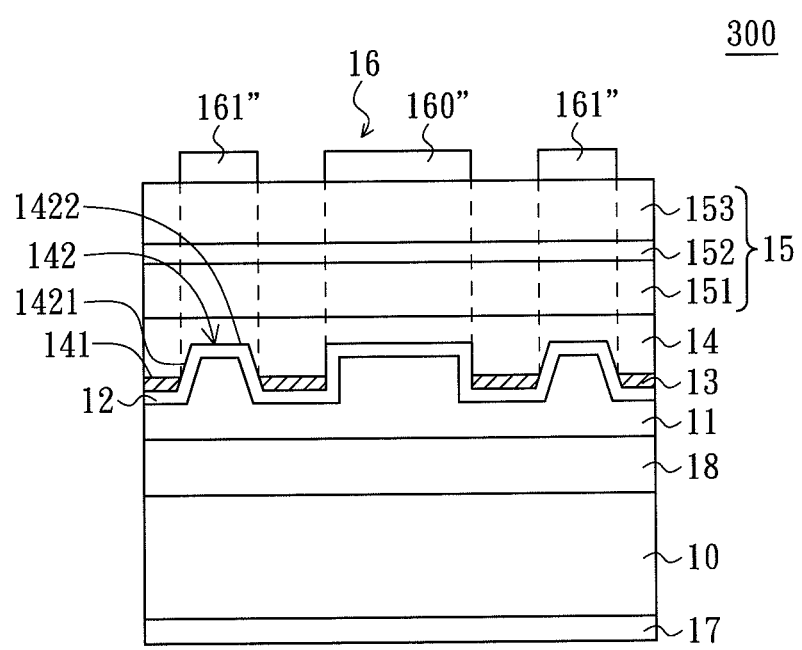
FIG. 3 shows a cross-sectional view of a light-emitting device in accordance with the third embodiment of the present disclosure.

FIG. 3 shows a light-emitting device 300 according to the third embodiment of the present disclosure. The third embodiment of the light-emitting device 300 has the similar structure with the first embodiment of the light-emitting device 100 except that the side wall surface 1421 of some of the recesses 142 is not inclined to the flat surface 141. In this embodiment, the recess 142 formed beneath the bonding pad 160" has the side wall surface 1421 substantially perpendicular to the flat surface 141, and the recess 142 formed beneath the extension 161" has the side wall surface 1421 inclined to the flat surface 141.

Figure 4B:
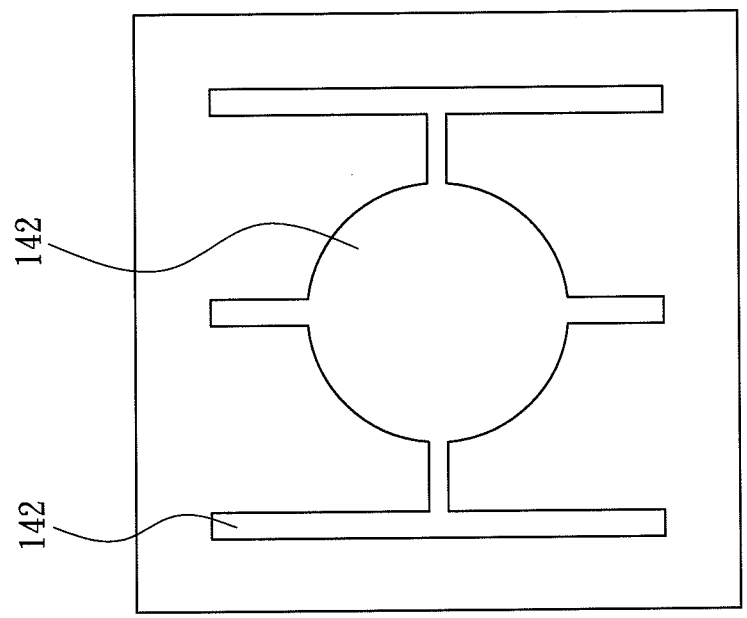
FIGS. 4A to 4C show plan views of recesses in accordance with the present disclosure.
Figure 4A:
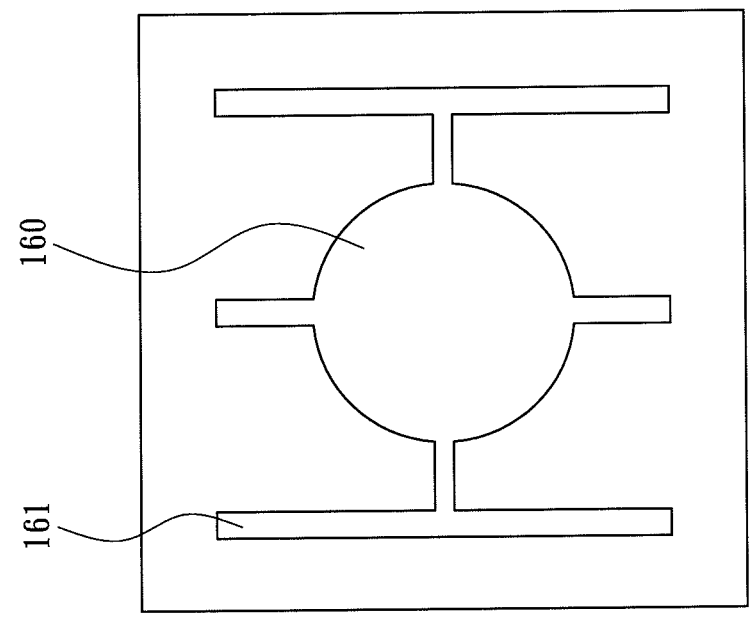
Figure 4C:
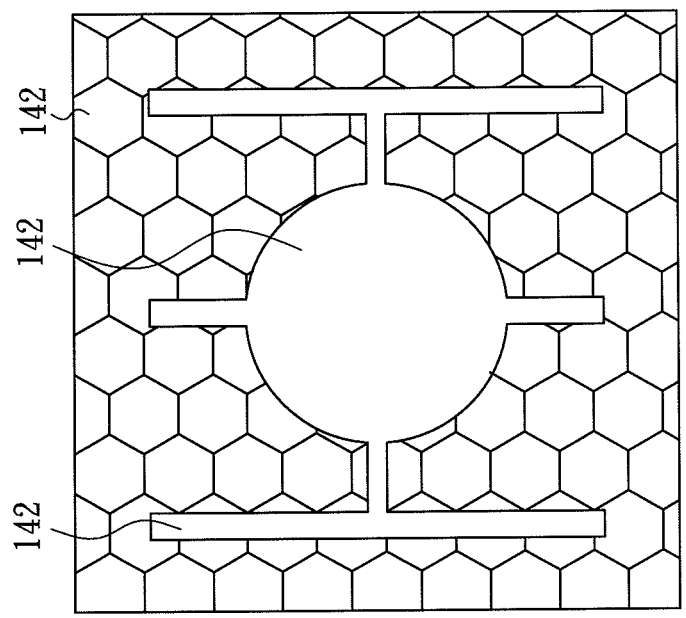

FIGS. 4A and 4B are plan views of the n-type electrode 16 and the recesses 142. The recesses 142 as shown in FIG. 4B have a first pattern which is geometrically similar to that of the n-type electrode 16 as shown in FIG. 4A and are formed beneath the n-type electrode 16. FIG. 4C is a plan view of the recesses 142 which further have a second pattern. The second pattern is a tessellation of hexagons which are not formed beneath the n-type electrode 16. Alternatively, in a plan view, the second pattern can be a circle, or a tessellation of triangle, rectangle, or pentagon. Depending on the actual requirements, the pattern of the n-side electrode 16 may vary and therefore the first pattern of the recesses 142 will vary with the pattern of the n-side electrode 16.

Figure 5A:
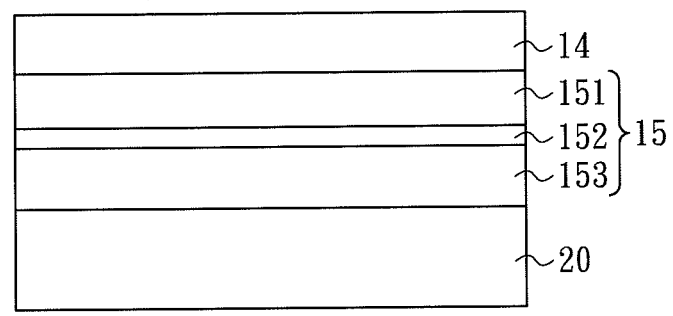
FIGS. 5A to 5G are cross-sectional views showing a method of making the light-emitting device of the second embodiment.
Figure 5B:
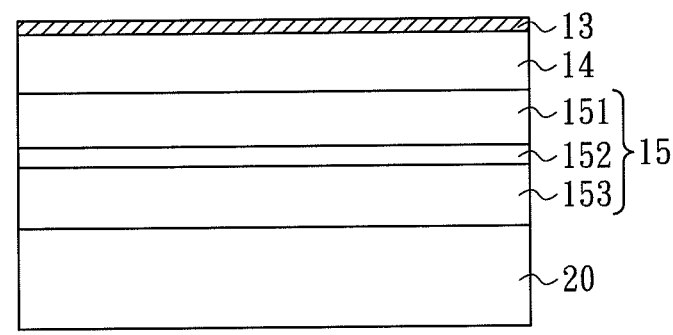
Figure 5C:
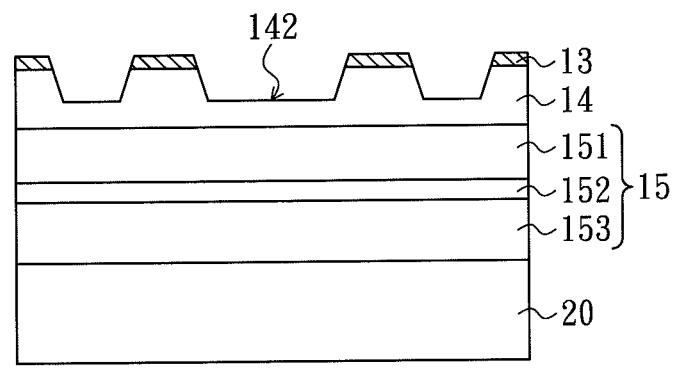
Figure 5D:
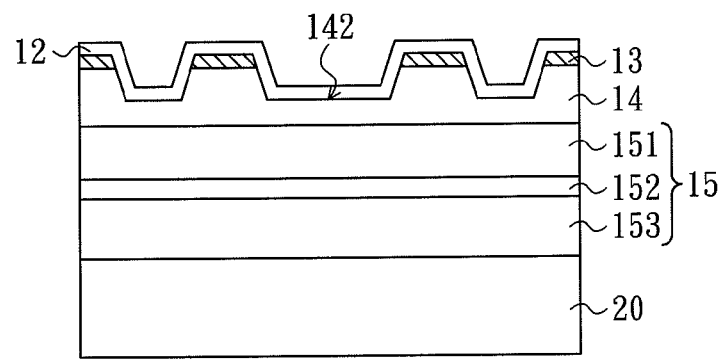
Figure 5E:
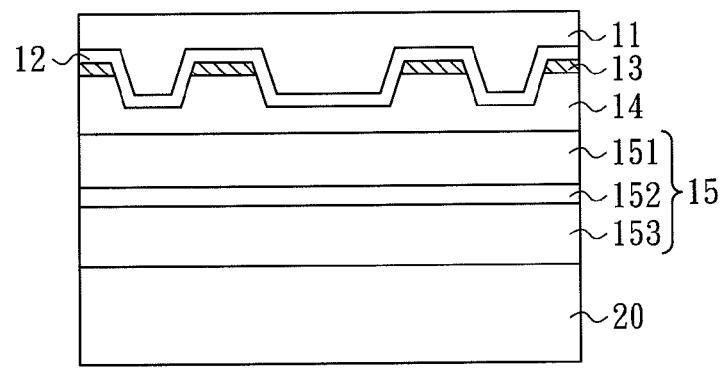
Figure 5F:
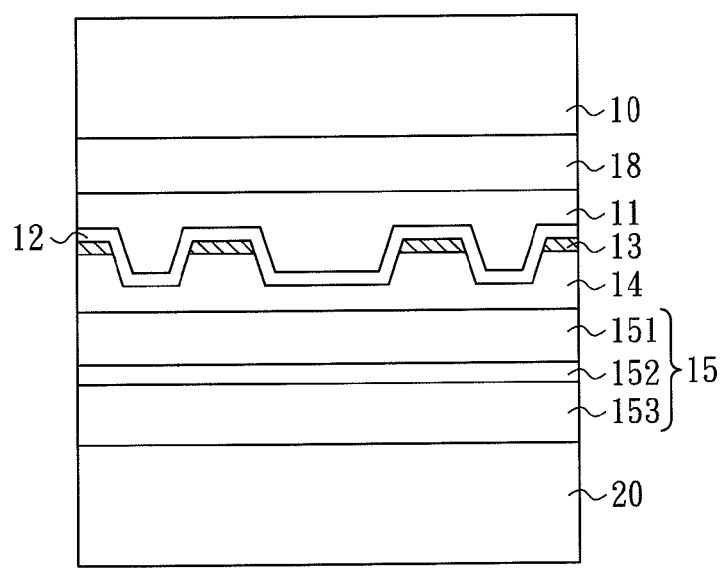
Figure 5G:
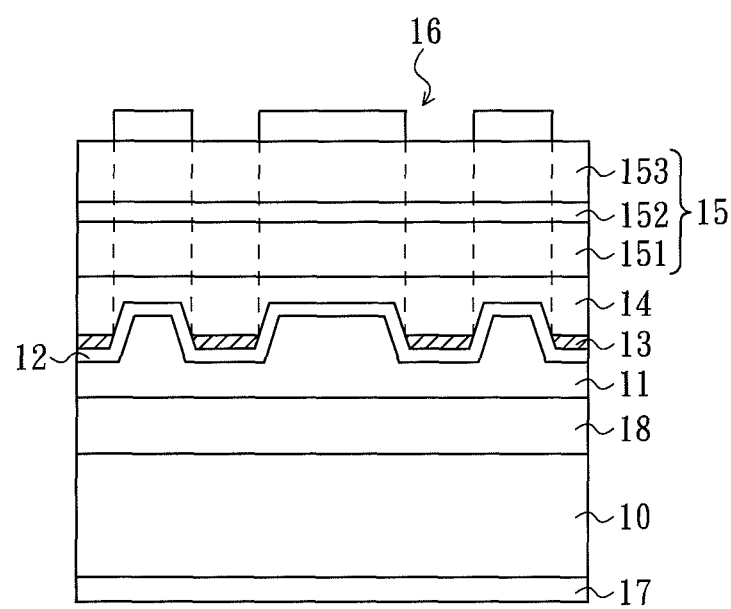

FIGS. 5A to 5G illustrate a method of making the light-emitting device 200 according to the second embodiment of the present disclosure. Referring to FIG. 5A, the n-type semiconductor layer 153, the active layer 152, the p-type semiconductor layer 151, and the semiconductor window layer 14 are sequentially grown on a growth substrate 20. Referring to FIG. 5B, the ohmic contact layer 13 is grown on the semiconductor window layer 14. The semiconductor window layer 14 has a thickness ranging from 1 μm to 10 μm and the ohmic contact layer 13 has a thickness less than 2000 Å. Alternatively, the semiconductor window layer 14 can be subjected to a doping treatment to form the ohmic contact layer 13. Referring to FIG. 5C, an etching process is carried out to remove portions of the ohmic contact layer 13 and further to remove portions of the semiconductor window layer 14 such that the recesses 142 are formed within the semiconductor window layer 14. Referring to FIG. 5D, the transparent conductive layer 12 is formed on and conformal to the ohmic contact layer 13 and the semiconductor window layer 14 by evaporating or sputtering. Therefore, the transparent conductive layer 12 is in contact with the semiconductor window layer 14 and the ohmic contact layer 13. It is noted that when the transparent conductive layer 12 is formed by spin coating, the recesses 142 is filled up with the transparent conductive layer 12. Referring to FIG. 5E, the reflective layer 11 is formed on the transparent conductive layer 12. Referring to FIG. 5F, the permanent substrate 10 is bonded to the reflective layer 11 through the bonding layer 18. Referring to FIG. 5G, the growth substrate 20 is separated from the n-type semiconductor layer 153 by etching. Subsequently, the n-side electrode 16 and the p-side electrode 17 are respectively formed on the n-type semiconductor layer 153 and the permanent substrate 10. The bonding layer 18 comprises metal or glue. The metal comprises gold (Au), indium (In), tin (Sn), and combinations thereof. The glue is made of a material selected from the group consisting of indium tin oxide (ITO), benzocyclobutene (BCB), epoxy resin (Epoxy), polydimethylsiloxane (PDMS), silicone (SiOx), aluminum oxide ($Al_2O_3$), titanium dioxide (TiO2), silicon nitride (SiNx), and combinations thereof.

EXAMPLES

Example 1 (E1)

The light-emitting device has a structure as shown in FIG. 2. The n-type semiconductor layer 153 of AlInP, the active layer 152 of AlGaInP, and the p-type semiconductor layer 154 of AlInP are sequentially grown on the growth substrate 20 of GaAs. The semiconductor window layer 14 made of GaP and having a thickness of 10 μm is grown on the p-type semiconductor layer 154. The ohmic contact layer 13 made of carbon-doped GaP is grown on the semiconductor window layer 14 by metal organic chemical vapor deposition (MOCVD). A wet etching is performed to etch portions of the ohmic contact layer 13 and the semiconductor window layer 14, thereby forming the recesses 142. The recesses 142 have a depth (H) of about 2 μm, and the depth ratio of the depth of the recesses 142 to the thickness of the semiconductor window layer 14 is about 20%. The transparent conductive layer 12 made of ITO is formed on the semiconductor window layer 14 by evaporating. The reflective layer 11 is a multi-layer structure of Ag/Ti/Pt/Au is formed on the transparent conductive layer 12. The permanent substrate made of Si is bonded to the reflective layer 11 by metal bonding process, and then the GaAs substrate 20 is removed. Subsequently, the n-type electrode 16 is formed on the n-type semiconductor layer 153 at position corresponding to the recesses 142 and has a pattern substantially equal to the first pattern of the recesses 142 (see FIG. 4A). The surface area ratio of the surface area of the ohmic contact layer 13 to the surface area of the semiconductor window layer 14 is about 85%, that is, the surface area of the recesses 142 is about 15% of the total area of the semiconductor window layer 14.

Example 2 (E2)

The light-emitting device of Example 2 has a similar structure with that of Example 1, except that the recesses 142 further have the second pattern of hexagon on which the n-type electrode 16 are not formed (see FIG. 4C). Accordingly, the surface area ratio of the surface area of the ohmic contact layer 13 to the surface area of the semiconductor window layer 14 is about 80%, that is, the surface area of the recesses 142 is about 20% of the total area of the semiconductor window layer 14.

Example 3 (E3)

The light-emitting device of Example 3 has a similar structure with that of Example 1, except that the thickness of the semiconductor window layer 14 is 1 μm. The recesses 142 have a depth (H) of about 0.8 μm, and the depth ratio of the depth of the recesses 142 to the thickness of the semiconductor window layer 14 is about 80%.

Example 4 (E4)

The light-emitting device of Example 4 has a similar structure with that of Example 2, except that the thickness of the semiconductor window layer 14 is 1 μm.

Comparative Example 1 (CE1)

The light-emitting device of Comparative Example 1 has a similar structure with that of Example 1, except that the ohmic contact layer 13 and the semiconductor window layer 14 are not etched. Therefore, the recesses 142 are not formed in the semiconductor window layer 14.

Comparative Example 1 (CE2)

The light-emitting device of Comparative Example 2 has a similar structure with that of Example 3, except that the ohmic contact layer 13 and the semiconductor window layer 14 are not etched. Therefore, the recesses 142 are not formed in the semiconductor window layer 14.

TABLE 1

|  | Luminous intensity (mcd) | Improved percentage |
|---|---|---|
| E1 | 469.18 | 118% |
| E2 | 493.68 | 124.1% |
| CE1 | 397.77 | 100% |

TABLE 2

|  | Luminous intensity (mcd) | Improved percentage |
|---|---|---|
| E3 | 396.08 | 112.5% |
| E4 | 459.21 | 130.4% |
| CE2 | 352.19 | 100% |

Tables 1 and 2 show experimental results. Compared to the Comparative Example 1, the light-emitting device of Example 1 has the luminous intensity of 469.18 mcd, which is increased by 18%, and the light-emitting device of Example 2 has the luminous intensity of 493.68 mcd, which is increased by 24.1%. Likewise, compared to the Comparative Example 2, the light-emitting device of Example 3 has the luminous intensity of 369.08 mcd, which is increased by 12.5%, and the light-emitting device of Example 4 has the luminous intensity of 459.21 mcd, which is increased by 30.4%. By forming the recesses 142 with the side wall surface 1422 that is inclined, light emitting from the light-emitting stack 15 is efficiently reflected by the side wall surface 1422 and is directed to escape from a light-emitting surface of the light-emitting stack 15, thereby improving the light emitting intensity. In addition, since the recesses 142 further have the second pattern, which indicates that the area of the recesses 142 in Examples 2 and 4 is higher (about 5%) than that in Examples 1 and 3, there are more side wall surfaces 1422 for reflecting the light emitting from the light-emitting stack 15. Therefore, the luminous intensity of the light-emitting device of Examples 2 and 4 is relatively higher.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
  a substrate;
  a transparent conductive layer disposed on the substrate;
  a semiconductor window layer formed on the transparent conductive layer and having a flat surface and a plurality of recesses, wherein each of the recesses having a side wall surface;
  a light-emitting stack formed on the semiconductor window layer and comprising a first conductivity semiconductor layer, a second conductivity semiconductor layer, and an active layer sandwiched between the first and second conductivity semiconductor layers; and
  an ohmic contact layer formed on the flat surface of the semiconductor window layer for ohmically contacting with the transparent conductive layer,
  wherein the side wall surface of one of the recesses is inclined with respect to the flat surface, and the contact resistance between the flat surface and the transparent conductive layer is less than that between the side wall surface and the transparent conductive layer, and
  wherein a surface area ratio of the surface area of the ohmic contact layer to the surface area of the semiconductor window layer ranges from 10% to 90%.

2. The light-emitting device of claim 1, wherein the semiconductor window layer and the ohmic contact layer comprises the same material.

3. The light-emitting device of claim 2, wherein the material is selected from the group consisting of GaP, InGaP, GaAs, AlGaAs, and combinations thereof.

4. The light-emitting device of claim 1, wherein the ohmic contact layer is an impurity-doped semiconductor layer.

5. The light-emitting device of claim 4, wherein the impurity comprise a material selected from the group consisting of Mg, Be, Zn, C, and combination thereof.

6. The light-emitting device of claim 1, further comprising an electrode formed on the light-emitting stack at position corresponding to the recesses of the semiconductor window layer.

7. The light-emitting device of claim 6, wherein each of the recesses further has a recessed surface, the contact resistance between the recessed surface and the transparent conductive layer is substantially equal to that between the side wall surface and the transparent conductive layer.

8. The light-emitting device of claim 6, wherein the electrode has a pattern, and the recesses has a first pattern geometrically similar to the pattern of the electrode.

9. The light-emitting device of claim 8, wherein the recesses further have a second pattern of tessellation.

10. The light-emitting device of claim 1, wherein the ohmic contact layer has a thickness less than 2000 Å.

11. The light-emitting device of claim 1, wherein the semiconductor window layer has a thickness ranging from 1 μm to 10 μm.

12. The light-emitting device of claim 11, wherein the recesses have a depth, the depth ratio of the depth of the recesses to the thickness of the semiconductor window layer ranges from 20% to 80%.

13. The light-emitting device of claim 1, wherein the side wall surface in each recess is inclined with respect to the flat surface at an angle greater than 90° and less than 180°.

14. The light-emitting device of claim 1, further comprising a reflective layer formed between the transparent conductive layer and the substrate.

* * * * *